United States Patent [19]
Kablanian

[11] Patent Number: 6,084,819
[45] Date of Patent: Jul. 4, 2000

[54] MULTI-BANK MEMORY WITH WORD-LINE BANKING

[75] Inventor: Adam Kablanian, San Jose, Calif.

[73] Assignee: Virage Logic Corp., Fremont, Calif.

[21] Appl. No.: 09/347,372

[22] Filed: Jul. 6, 1999

[51] Int. Cl.[7] .................................................. G11C 8/00
[52] U.S. Cl. ............................... 365/230.03; 365/230.04; 365/203
[58] Field of Search .................. 365/230.03, 230.04, 365/230.06, 230.02, 203

[56] References Cited

U.S. PATENT DOCUMENTS

| | | | |
|---|---|---|---|
| 4,849,937 | 7/1989 | Yoshimoto | 365/230.04 |
| 5,287,527 | 2/1994 | Delp et al. | 365/230.03 |
| 5,493,535 | 2/1996 | Cho | 365/230.04 |

*Primary Examiner*—Tan T. Nguyen
*Attorney, Agent, or Firm*—Fenwick & West LLP

[57] ABSTRACT

A multiple bank memory array includes a combined memory array, an X-decoder, a first word-line driver, a second word-line driver, a reference column, a Y-multiplexer and pre-charging circuit, a sense amplifier and input/output circuit, and control and precoding logic. Signals are received and applied to the combined memory array and the other components via the control and pre-decode logic and the input/output circuit. The control and pre-decode logic receives control signals to control and address the combined memory array, and uses a single bit for two dimensional decoding. This architecture for multiple bank memory cell arrays a novel technique for word-line banking in one embodiment that provides a combined array, does not require routing and eliminates redundant reference columns.

16 Claims, 9 Drawing Sheets

MULTI-BANK MEMORY WITH WORD-LINE BANKING

BACKGROUND OF THE INVENTION

1. Field of the Invention

This invention relates generally to the field of memory logic devices and more specifically to memory devices having multiple banks of memory arrays. More particularly, the present invention relates to memory arrays that allow for word-line banking.

2. Description of the Background Art

Memory devices are well known in the semiconductor industry. Memory cores for integrated circuits continue to be improved. Because of the proliferation and popularity of Application Specific Integrated Circuits (ASIC), there is a need for improved designs for memory arrays. New memory arrays are needed because of the every decreasing size and power requirements. For example, new uses for ASICs such as cellular telephones, portable computers, and hand held devices require new memory arrays that require less circuit area to implement, and consume less power to extend battery life.

One approach used in the prior art to provide ultra low power and high speed memory devices has been to use multiple banks of memory arrays. A typical prior art multiple bank memory is shown in FIG. 1. As can be seen, the prior art multiple bank memory includes an X-decoder 108, control and pre-decoding logic 120, and pairs of reference columns 102, 114, memory cell arrays 104, 112, word-line drivers 106, 110, pre-charge circuits and Y-decoders or multiplexers 116, 122, and sense amplifiers and input/output (I/O) circuits 118, 124. While the prior art provides some power reduction and speed improvement, the prior art suffers from a number of problems.

In particular, when used in a compiler implementation, the conventional banking approach has a number of shortcomings. First, routing of signals in the memory is difficult and consumes circuit area, in addition to requiring place and route capability for the manufacturing process. As depicted by the lines between the sense amplifiers 118 and 124, routing adds multiplexing, delay and area as compared with single bank architectures. Second, there is an area penalty because the multiplexer lines need to be switched between arrays. Third, the additional capacitance of the multiplexer lines degrades the performance of the device. Finally, the conventional architecture shown in FIG. 1 provides non-optimum aspect ratios, especially when the word size increases in width. This often results in an additional area penalty and a tighter pitch with which to work.

Therefore, there is a need for systems and method for constructing multiple bank memory cell arrays that are smaller in size, consume less power, and reduce electrical interference.

SUMMARY OF THE INVENTION

The present invention overcomes the deficiencies and limitations of the prior art with a unique architecture for multiple bank memory cell arrays. The architecture for multiple bank memory cell arrays is advantageous because it includes a novel technique for word-line banking that provides a combined array, does not require routing and eliminates redundant reference columns. The word-line banking of the present invention may also be used independent of the type of memory cells forming the combined array.

A preferred embodiment of a multiple bank memory array according to the present invention includes a combined memory array, an X-decoder, a first word-line driver, a second word-line driver, a reference column, a Y-multiplexer and pre-charging circuit, a sense amplifier and input/output circuit, and control and pre-coding logic. Signals are received and applied to the combined memory array and the other components via the control and pre-decode logic and the input/output circuit. The control and pre-decode logic receives control signals to control and address the combined memory array. Data is input and output to the combined memory array via the input/output circuit. The combined array is particularly advantageous because it reduces the power consumed by activating only half the word line at a given time. In other words, half the word line is switching and half the bit lines are pre-charging and discharging. The combined array is also advantageous in that routing is not required for the multiple banks because the arrays are merged into a single array that is partitioned using the most significant bit of the X address value.

These and other features and advantages of the present invention may be better understood by considering the following detailed description of a preferred embodiment of the invention. In the course of this description, reference will frequently be made to the attached drawings.

DETAILED DESCRIPTION OF THE PREFERRED EMBODIMENTS

Figure 1:
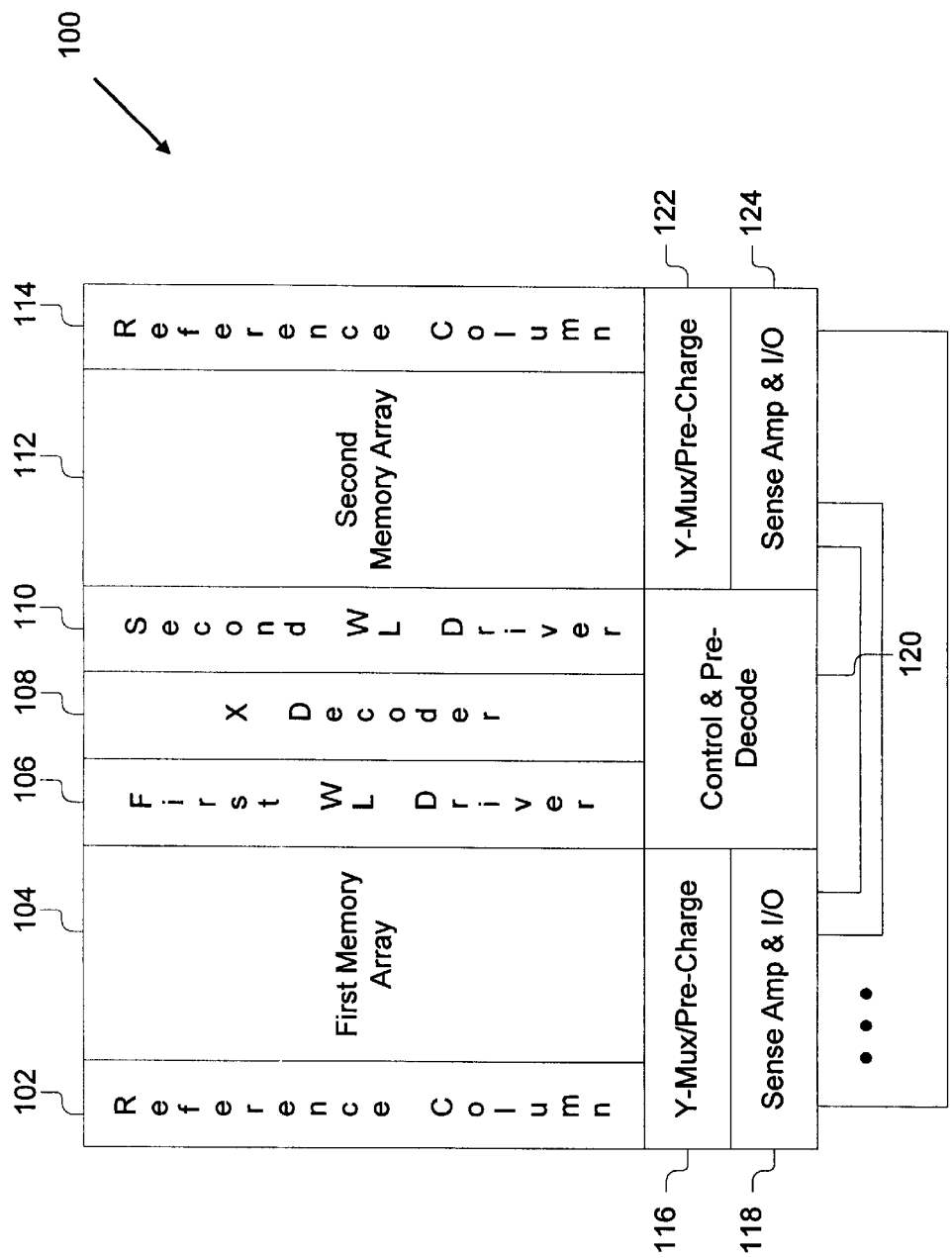
FIG. 1 is a block diagram of a prior art multi-bank memory unit.
Figure 2:
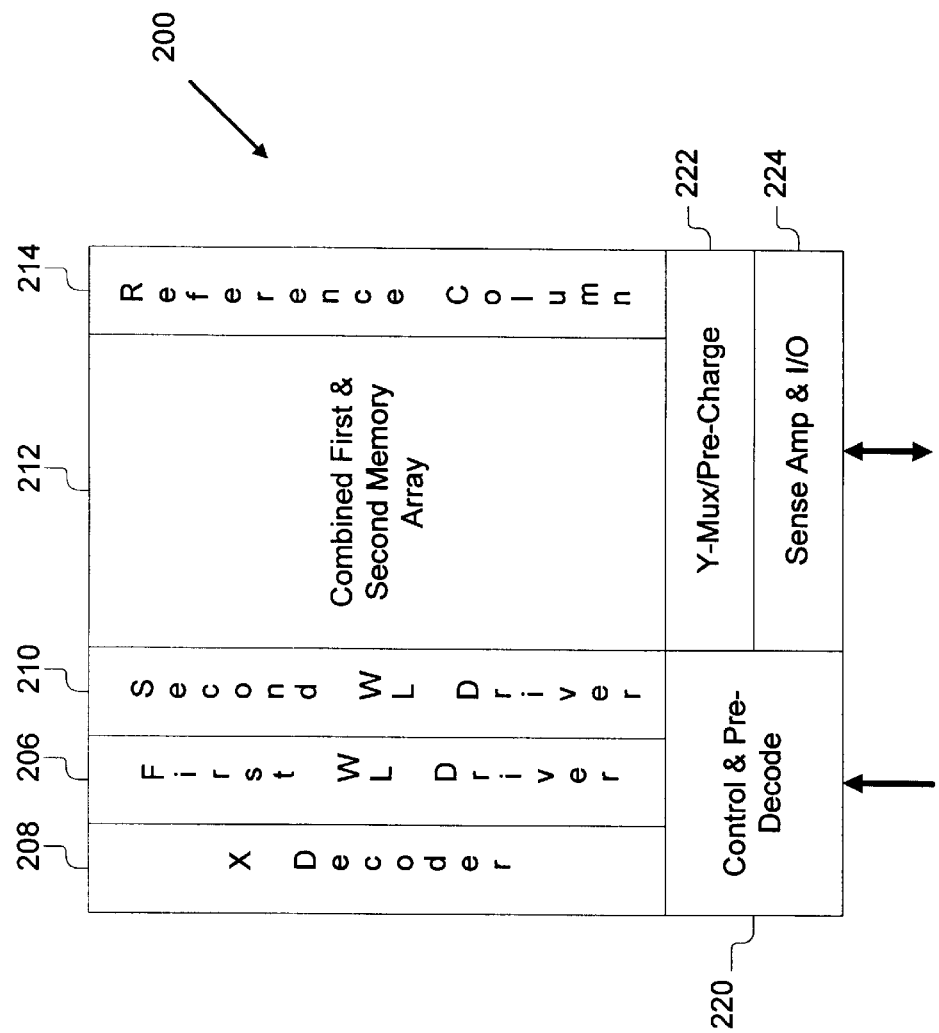
FIG. 2 is a block diagram of a first and preferred embodiment of multi-bank memory unit using word-line banking according to the present invention.

Referring now to FIG. 2, a block diagram of a first and preferred embodiment of the multi-bank memory unit 200 using word-line banking according to the present invention is shown. The first embodiment of the multi-bank memory unit 200 preferably comprises a combined memory array 212, an X-decoder 208, a first word-line driver 206, a second word-line driver 210, a reference column 214, a Y-multiplexer and pre-charging circuit 222, a sense amplifier and input/output circuit 224, and control and pre-coding logic 220. The present invention includes a number components including those just identified. Each of these components is conventional in certain respects, however, many of the components are different in ways (that will be identified below as each is discussed) that allow the present invention to provide an architecture for multi-bank memories that requires less area to implement, requires less power to operate and can be used repeatedly in a tiled design. For example, the multi-bank memory unit 200 utilizes only a single reference column 214 which reduces the area of the memory unit 200 as well as reducing the power requirements. Moreover, the present invention is not discussed with regard to a particular, word or array size since the number of bits input and output could be any number adapted to the needs of the user.

The control and pre-decoding logic 220 receives signals for processing data including control and addressing signals. The control and pre-decoding logic 220 in turn transmits these signals to the other components of the multi-bank memory unit 200 to control storage in and retrieval of data from the memory unit 200, as will be described in more detail below. The control and pre-decoding logic 220 is formed from conventional digital logic devices formed as part of an integrated circuit, and is similar to conventional types of control logic. The control and pre-decoding logic 220 is notably different in at least one respect, namely that at least one bit, preferably the most significant bit of the X-address decoder, is used to control the operation of the word-line drivers 206, 210 and the Y-multiplexer and pre-charging circuit 222.

The X-decoder 208 is coupled to the control and pre-decoding logic 220 to receive addressing signals from the control and pre-decoding logic 220. The X-decoder 208 receives the address signals, identifies which words of the array 212 are to be asserted and generates a signal for each word to be asserted and outputs the signal. The X-decoder 208 has a conventional design as will be understood to those skilled in the art. The outputs of the X-decoder 208 are coupled to the first word-line driver 206 and the second word-line driver 210. The first word-line driver 206 and the second word-line driver 210 are advantageously positioned adjacent and closed to the X-decoder 208 to minimize the length of signal lines connecting the devices 206, 208, 210. The first word-line driver 206 and the second word-line driver 210 are preferably groups of buffer drivers that receive signals from the X-decoder 208 and assert and amplify the signals over a portion of the array 211 so that particular words are accessed. The first word-line driver 206 preferably drives the output of the X-decoder 208 over a first half of the array 212 referred to the left array, left plane or first plane, and the second word-line driver 210 drives the output of the X-decoder 208 over a second half of the array 212 referred to the right array, right plane or second plane. Thus, signals provided in the horizontal direction provide the address input from the X-decoder 208 to the combined memory array 212.

The present invention advantageously provides the multiple bank array as a combined memory array 212. The combined memory array 212 preferably includes a plurality of memory cells grouped for access on a word basis. The combined memory array 212 preferably accesses a first half of the cells as a first or left plane and the other half of the cells as the second or right plane. The individual memory cells have a conventional design, however, are enabled on a word basis. The individual memory cells are described in more detail below with reference to FIGS. 6A–6C, and the word size may be any size from 2 to n. Even though they are referred to and shown as distinct portions of the array, those skilled in the art will realize that the array 212 may organize the particular cells in any number of ways including but not limited to rows of alternating cells of the left array and the right array; rows of two cells of the left array then two cells of the right array repeated across the array; and rows of the cells of left array and then cell of the right array. The aspect ratio of the array 212 may be controlled by grouping cells in a row by groups of 4, 8, 16, 32 or other powers of 2 and then alternating between the left plane the right plane as describe above for groups of 2. The present invention advantageously operates the combined memory array 212 with about half the power compared with the prior art by switching half the word lines at any given time and also charging or discharging only half the bit lines. The organization as a combined array 212 is also advantageous because it provides the optimum aspect ratio for the memory unit 200, especially for wide bit configurations.

The reference column 214 is provided to a self timed reset signal the array 212. The reference column 214 is preferably located adjacent to the combined memory array 212 on the side opposite the word-line drivers 206, 210. In contrast to the prior art, the present invention requires only a single reference column 214 for operation. This is significant because the area penalty in having to provide a second reference column can be as much as eight times the area of the reference column due to the additional area required lines for input/output connections. Because of the unique architecture of the present invention and the usage of a combined array 212, only a single reference column is needed. Thus, the area and power consumed by a second reference column are eliminated with the present invention.

Below the combined memory array 212, the present invention positions the Y-multiplexer and pre-charging circuit 222, and the sense amplifiers and input/output circuit 224. Thus, it can be seen with the architecture of the present invention, no significant routing is required to achieve word-line banking. The Y-multiplexer and pre-charging circuit 222 are conventional types, with the pre-charging circuit 222 charging the lines of the array 212 for reading and writing, and the Y-multiplexer providing one of two or more inputs to the sense amplifiers and input/output circuit 224. The Y-multiplexer and pre-charging circuit 222 are coupled to the cells of the array by bit lines extending generally vertically over the length of the array 212. The present invention advantageously reduces the number of sense amplifiers 224 by at least half by providing the Y-multiplexers, reading only half the array at a given time, and providing a single sense amplifier for multiple bit lines. The sense amplifiers and input/output circuit 224 are positioned below the Y-multiplexer and pre-charging circuit 222. The sense amplifiers generate data to be output from the array 212. This data is passed to the input/output circuit for transmission out of the memory unit 200. The input/output circuit is also the source of data for storage in the array 212 from outside the memory unit 200.

Figure 3A:
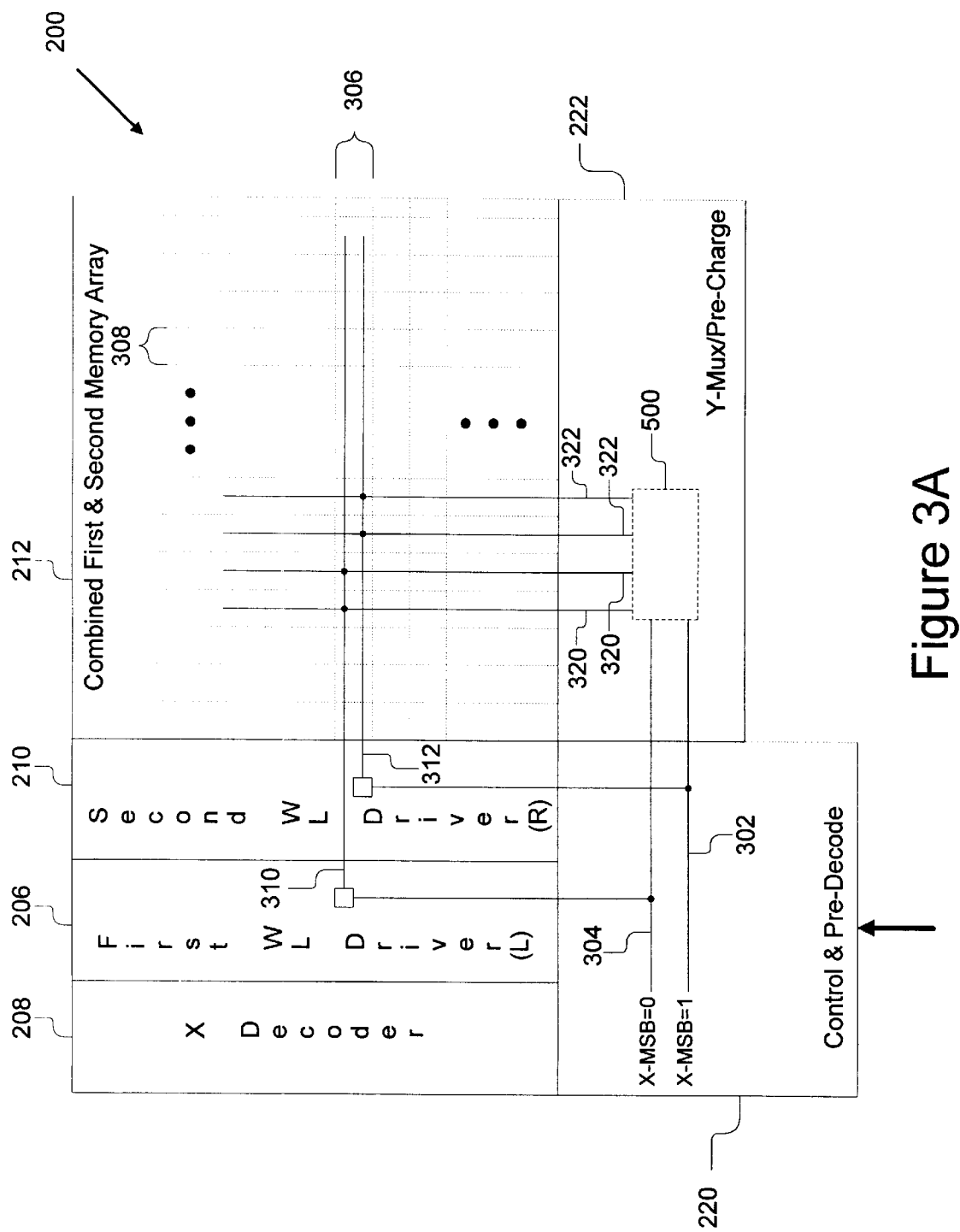
FIG. 3A is a partial block diagram of the first embodiment of the multi-bank memory unit according to the present invention showing cells and word lines.

Referring now to FIG. 3A, a primary feature of the present invention is highlighted. FIG. 3A shows a partial block diagram of the first embodiment of the multi-bank memory unit 200 including some cells and word lines, and a particular portion of the control logic 220. The multi-bank memory unit 200 advantageously uses one bit preferably the most significant bit) of the X address to: 1) select which word lines 310, 312 between the word lines 310 for first plane and the word lines 312 for the second plane that will be active; and 2) select which corresponding ones from pairs of Y-multiplexer and pre-charging circuits will be operational. As noted above, the control and pre-decoding logic 220 receives information for addressing the cells of the combined memory array 212. In addition to passing this information to the X-decoder 208 for accessing the array 212 in one dimension, the control and pre-decoding logic 220 also includes logic for generating a first selection signal on line 304 and a second selection signal on line 302. The first and second selection signals are preferably asserted based on the value of the most significant bit (MSB) of the X dimension address. Those skilled in the art will recognize that a variety of other control input signals may be used as the basis to generate the first and selection signals such as other bits of the X address, as well as that the selection logic may be constructed from combinational logic. In the preferred embodiment by way of example, if the MSB of the X address has a value of 0, then the first selection signal on line 304 is asserted. On the other hand, if the MSB of the X address has a value of 1, then the second selection signal on line 302 is asserted.

Continuing to refer to FIG. 3A, the first selection signal is provided to the first word-line driver 206 via line 304. The first word-line driver 206 uses the signal to enable the application of signals on word lines 310 as represented by the box in FIG. 3. In other words, the first selection signal controls whether the first word-line driver 206 is able to send word line signals on line 310 to the array 212. Although only shown for a single row of cells 306, those skilled in the art will understand how the signal on line 304 is used for all rows in the first plane of the combined memory array 212. Similarly, the control and pre-decoding logic 220 is coupled by line 302 to the second word-line driver 210 to provide the second selection signal. The second selection signal on line 302 is used by the second word-line driver 210 to control whether the second word-line driver 210 is able to provide word line signals on line 312 to the rows 306 of cells in the second plane of the combined memory array 212. This feature is best shown by the dots in respective cells of the array 212, where the dots represent connections to and providing of the driver signals to respective cells of the array 212. Each column 308 of cells of the array 212 are coupled by bit lines 320, 322 that extend to the Y-multiplexer and pre-charging circuit 222. Preferably, there are a plurality of bit lines for each column of cells and these bit lines are represented by lines 320, 322. For example, for an array of single port memory cells, lines 320, 322 each represent two bit lines, whereas for an array of dual port memory cells, lines 320, 322 each represent four bit lines as will become apparent from the discussion below of FIG. 6A–6B. As shown, the signal lines 302 and 304 are also coupled to the Y-multiplexer and pre-charging circuit 222, and are used to control their operation as will be discussed below with reference to FIG. 5. As shown in FIG. 3A, a plurality of portions 500 of the Y-multiplexer and pre-charging circuit 222 are provided (although only one is shown) within which bit lines 320, 322 from the left and right array, and the first and second selection signal lines 302, 304 converge to provide data and control for operation of the Y-multiplexer and pre-charging circuit 222 such that a single sense amplifier may be used for a number of columns of the combined memory array 212.

This use of a single bit to control both X-decoding via the word-line drivers 206, 210 and the Y-multiplexer and pre-charging circuit 222 provides a significant area reduction since the number of I/O buffers and sense amplifiers can be reduced by nearly half. Since planes of the array are alternatively used using the MSB for control this provides a significant area savings in addition to the power savings.

Figure 3B:
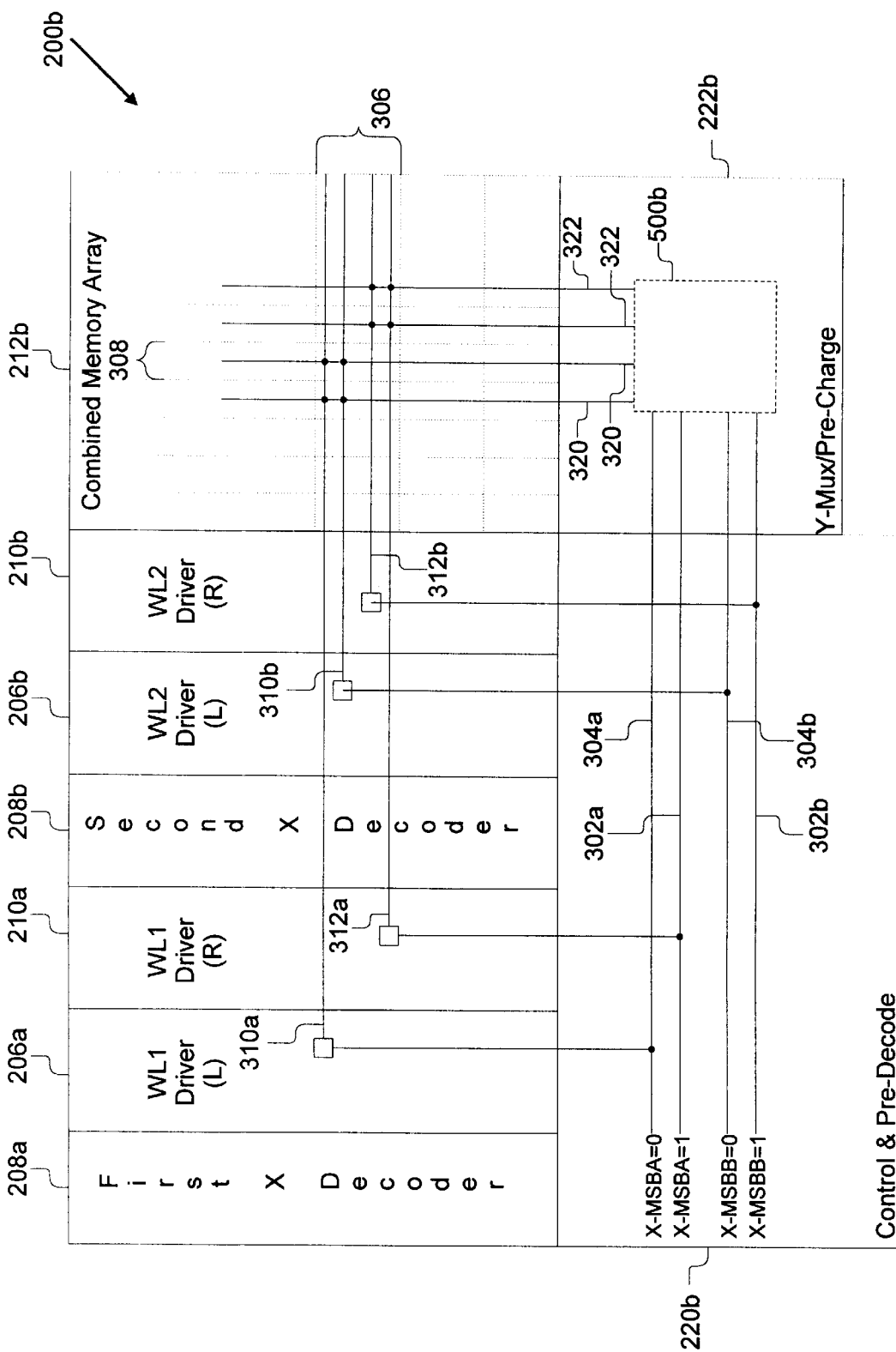
FIG. 3B is a partial block diagram of a second embodiment of the multi-bank memory unit according to the present invention showing cells, word lines and portions of the control logic.

Referring now to FIG. 3B, a second embodiment of the multi-bank memory unit 200b according to the present invention is shown. The second embodiment of the memory unit 200b is an adaptation of the present invention for use with dual port memory cells. For ease of understanding, like reference numerals have been used for parts having functionality similar to that described above with reference to FIG. 3A. As shown in FIG. 3B, the dual port cells are represented by each cell having a pair of dots in contrast to FIG. 3A where only there is only a single dot for each cell. Since the cells are dual port, each cell is capable of receiving two addresses for reading and writing. The second embodiment of the multi-bank memory unit 200b preferably comprises a combined memory array 212b, an first X-decoder 208a, a second X-decoder 208b, a first, second, third and fourth word-line drivers 206a, 206b, 210a, 210b, the Y-multiplexer and pre-charging circuit 222b, and control and pre-coding logic 220b. Although not shown in FIG. 3B, the multi-bank memory unit 200b includes a reference column 214 and a sense amplifier and input/output circuit 224.

The combined memory array 212b is similar to that of FIG. 3A, except that it is a dual port memory instead of a single port memory. The combined memory array 212b has a left and a right plane, and differs by providing two word lines for each cell and four bit lines for each cell, as will be discussed with reference to FIG. 6B below.

Since the combined memory array 212b is capable of receiving two words, the second X-decoder 208b, and additional word-line drivers 206b, 210b are added to provide such signals. The first X-decoder 208a and the WL1 word-line drivers 206a, 210a are provided to generate the first word address. In particular, the first X-decoder 208a decodes the first word address and is coupled to the control logic and pre-decode logic 220 to receive the first word address. The first X-decoder 208a works as described above to assert the appropriate rows of the combined array 212b using the WL1 word-line drivers 206a, 210a by generating the first word line signals on lines 310a, 312a. Based on the row specified by the first X-decoder 208a, the WL1 (L) word-line driver 206a will provide word line signals using signal line 310a to the left portion of the array 212b and the WL1(R) word-line driver 210a will provide word line signals using signal line 312a to the right portion of the array 212b for the first word address. The second X-decoder 208a operates in a similar manner but decodes the second word address. The second X-decoder 208a is correspondingly coupled to the WL2 (L) word-line driver 206b and the WL2 (R) word-line driver 210b to respectively provide the second word line signals to the left and right portions of combined array 212b for the second word address. The WL2 (L) word-line driver 206b and the WL2 (R) word-line driver 210b provide the word line signals using signal lines 310b and 312b, respectively, to the left and right portions of the array 212b. The Y-multiplexer and pre-charging circuit 222b and control and pre-coding logic 220b provide basically the same functionality as has been described above with reference to FIG. 3A. One notable difference is shown for the control and pre-coding logic 220b. As can be seen, the second embodiment of the multi-bank memory unit 200b also advantageously uses one bit (preferably the most significant bit) of each X address to: 1) select which word lines 310a, 310b, 312a, 312b between the word lines 310a, 310b for first plane and the word lines 312a, 312b for the second plane that will be active; and 2) select which corresponding ones from pairs of Y-multiplexer and pre-charging circuits will be operational. The control and pre-coding logic 220b is also modified to pass the addresses information for the two words to the first and second X decoder 208, 208b respectively, as will be understood to those skilled in the art. More specifically, since two address words are provided to the array 212b, one for Port A and one for Port B, the control and pre-coding logic 220b is modified as compared to that of FIG. 3A. The control and pre-coding logic 220b uses a bit, preferably the most significant bit, of each X word address to control respective word-line drivers 206a, 206b, 210a, 210b and respective portions of the Y-multiplexer and pre-charging circuit 222b. As shown, bit values from the first address word (Port A) are provided on lines 302a, 304a to the WL1 (L) driver 206a and the WL1 (R) driver 210a to alternatively enable the left and right array portions for the first word, and similarly, bit values from the second address word (Port B) are provided on lines 302b, 304b to the WL2 (L) driver 206b and the WL2 (R) driver 210b to alternatively enable the left and right array portions for the second word. The control and pre-coding logic 220b is also modified to accept two words and provide the words to the appropriate X decoder 208a, 208b. The control and pre-coding logic 220b provides these same bits of the first and second words to the portion 500b of the Y-multiplexer and pre-charging circuit 222b, there are four signal lines provided to the portion 500b as compared with only two signal lines for single port array 212 embodiment.

Figure 4:
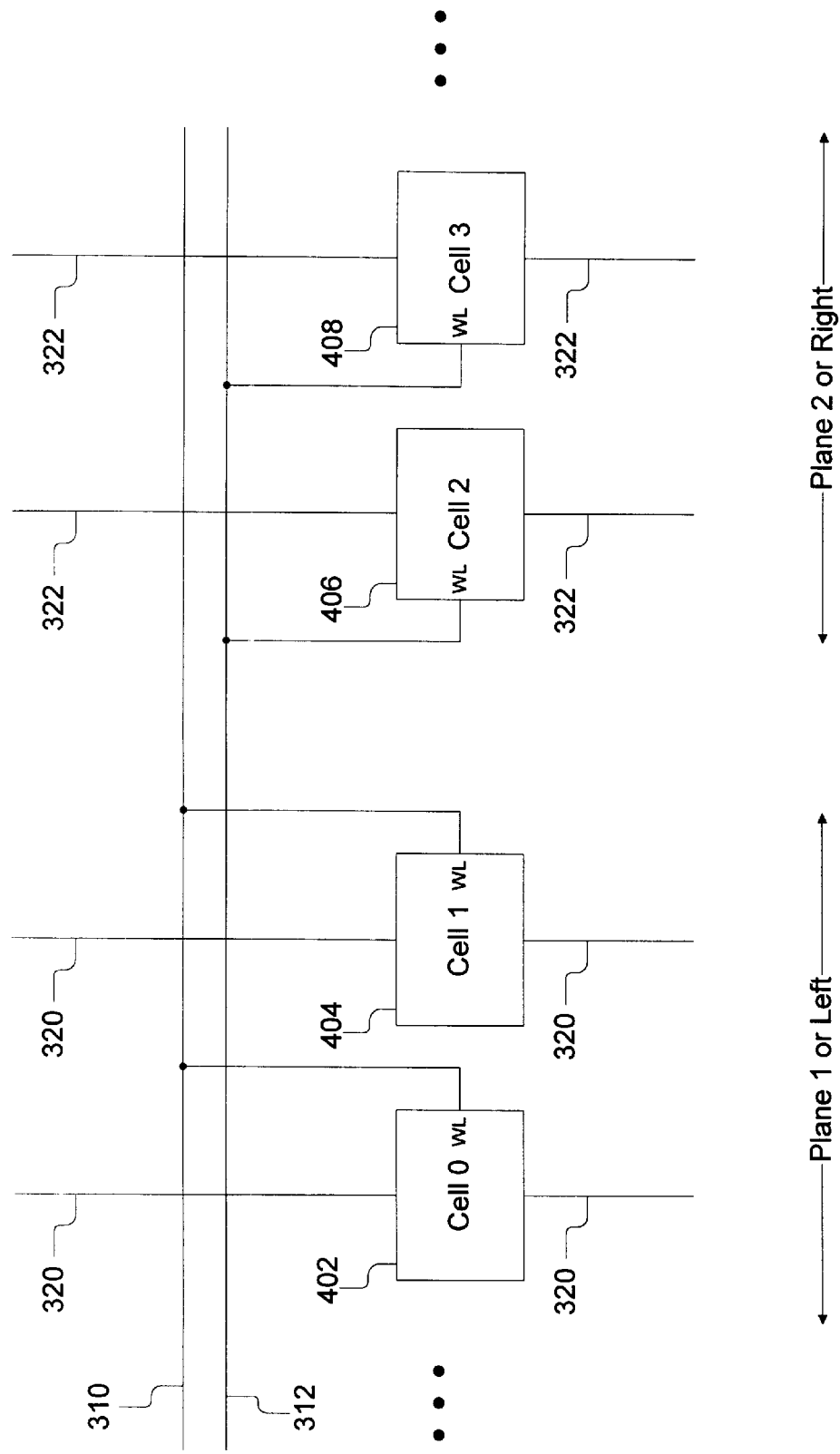
FIG. 4 is a block diagram of a plurality of cells of the multi-bank memory unit showing a word signal line pair and their coupling to the cells.

Referring now to FIG. 4, a block diagram of a plurality of cells 402, 404, 406, 408 from the combined array 212 of the first embodiment of the multi-bank memory unit 200 and a word line pair 310, 312 and their couplings to the cells 402, 404, 406, 408 are shown. FIG. 4 shows only a small portion of a row 306 of cells 402, 404, 406, 408 that forms the array 212. Cells 402 and 404 represent two bits of a word from the first plane or array of the combined memory array 212. Cells 406 and 408 represent two bits of a word from the second plane or array of the combined memory array 212. As will be understood for those skilled in the art, the row extends both to the left and the right for less significant bits of the first plane and more significant bits of the second plane, respectively. As shown, each cell 402, 404 in the left plane has a word line input coupled to line 310 to receive signals from the first word-line driver 206. The cells 406, 408 of the right plane are similarly coupled, but to word line 312 to receive signals from the second word-line drivers 210. FIG. 4 also illustrates the coupling of pairs of bit lines 320 and 322 for each respective cell 402, 404 and 406, 408. Each cell 402, 404, 406 and 408 is coupled to cells in the column 308 above and below the current row of cells 402, 404, 406, 408. Those skilled in the art will recognize how the cells of the second embodiment 200b are similarly coupled to pairs of word lines for each cell. This will become even further apparent when considered below with reference to FIG. 6B.

Figure 5:
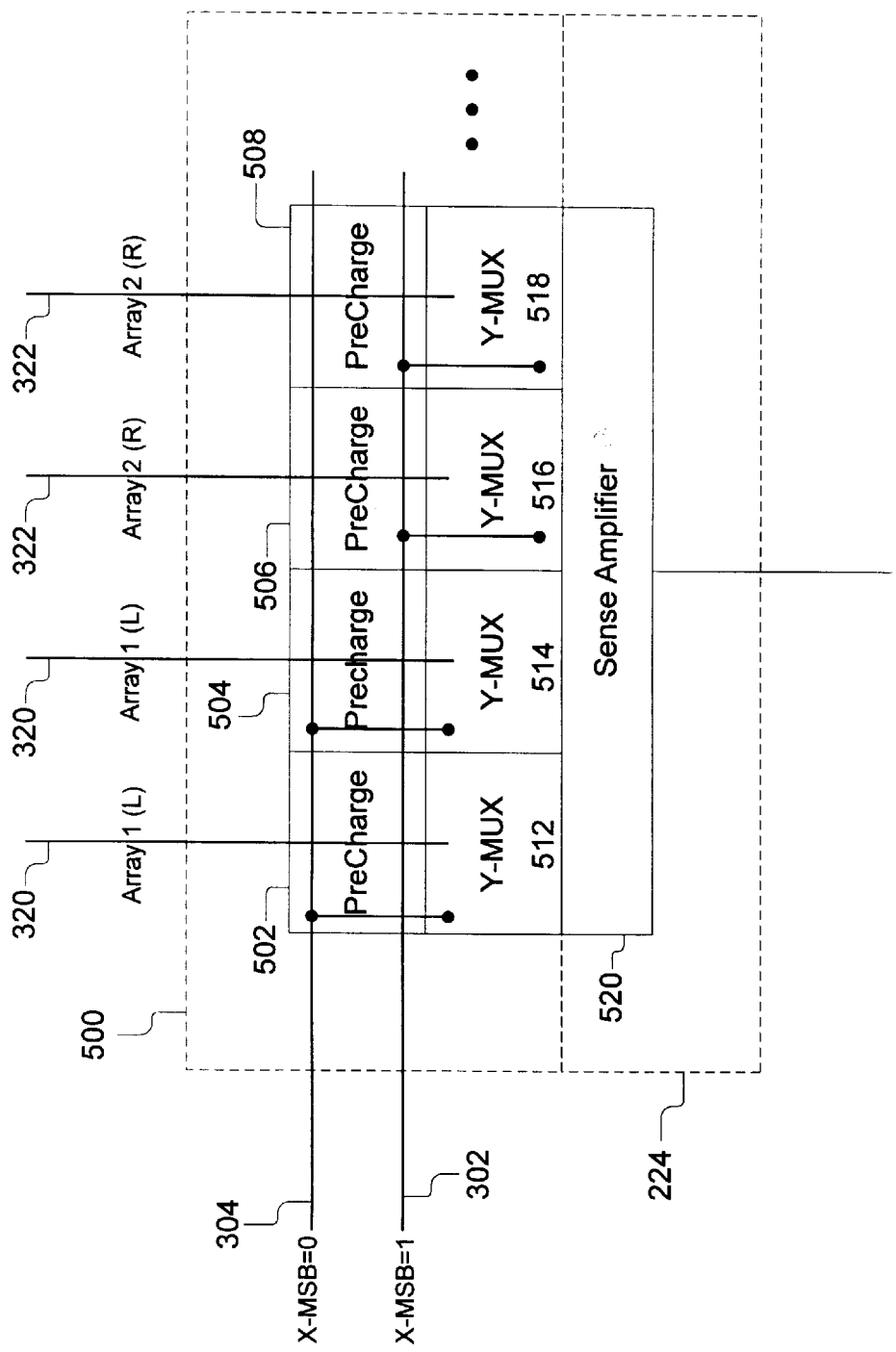
FIG. 5 is a block diagram of a portion of the multiplexer and pre-charging unit for use in the multi-bank memory unit of the present invention.

As shown in FIG. 5, the first and second selection signals are also provided to the Y-multiplexer and pre-charging unit 222 via lines 304 and 302, respectively. FIG. 5 illustrates a block diagram of only a portion 500 of the Y-multiplexer and pre-charging unit 222 and part of the sense amplifiers and input/output circuit 224 for the multi-bank memory unit 200 of the present invention. As shown, the Y-multiplexer and pre-charging unit 222 includes a plurality of pre-charging circuits 502, 504, 506, 508 and a plurality of Y-multiplexer circuits 512, 514, 516, 518. Each pre-charging circuit 502 corresponds to a Y-multiplexer circuit 512 for reading and writing a column of the array 212. For cells in a given column, they are read and written using a corresponding Y-multiplexer, pre-charging unit, and sense amplifier. For example, cells using the first bit line 320 would utilize pre-charging unit 502, Y-multiplexer 512 and sense amplifier 520. Similarly, cells using the second bit line 322 would utilize pre-charging unit 506, Y-multiplexer 516 and sense amplifier 520. The sense amplifiers and input/output circuit 224 is only partially shown as one sense amplifier 520 in FIG. 5 even though the sense amplifier and input/output circuit 224 includes a plurality of sense amplifiers. The present invention advantageously reduces the number of sense amplifiers by more than half as compared with the prior art since a single sense amplifier can be used for multiple columns of the array 212. This number could be any number columns from two to n, preferably powers of two, despite FIG. 5 only showing a single sense amplifier for four columns: two columns from the left array and two columns from the right array.

The first selection signal on line 304 is coupled to the pre-charging circuits 502, 504, and the Y-multiplexer circuits 512, 514 corresponding to columns of the left array. In a like manner, the second selection signal on line 302 is coupled to the pre-charging circuits 506, 508, and the Y-multiplexer circuits 516, 518 corresponding to columns of the right array. These lines 304, 302 are used to control which of the pre-charging circuits 502, 504, 506, 508 and Y-multiplexer circuits 512, 514, 516, 518 are enabled for operation. Since the first and second selection signals are only alternatively asserted, either pre-charging circuits 502, 504 and the Y-multiplexer circuits 512, 514 are operational or pre-charging circuits 506, 508 and the Y-multiplexer circuits 516, 518 are operational. Therefore, according to the architecture of the present invention half of the array is guaranteed to not be in use, power normally used for such pre-charging circuits can be saved by effectively disabling their use via control lines 304 and 302. Moreover, as noted only a single sense amplifier is need to read from four different columns of the array. As shown, sense amplifier 520 is used to read either cells from the first plane via Y-multiplexer 512, 514 or cells from the second plane via Y-multiplexer 516, 518. This architecture is particularly advantageous because of the area savings due to eliminating unneeded sense amplifiers and due to the power savings arising for alternate used of the pre-charging circuits. The savings in power is significant because the sense amplifiers and pre-charging/discharging of bit lines account for most of the power consumption of the array 212.

Figure 6A:
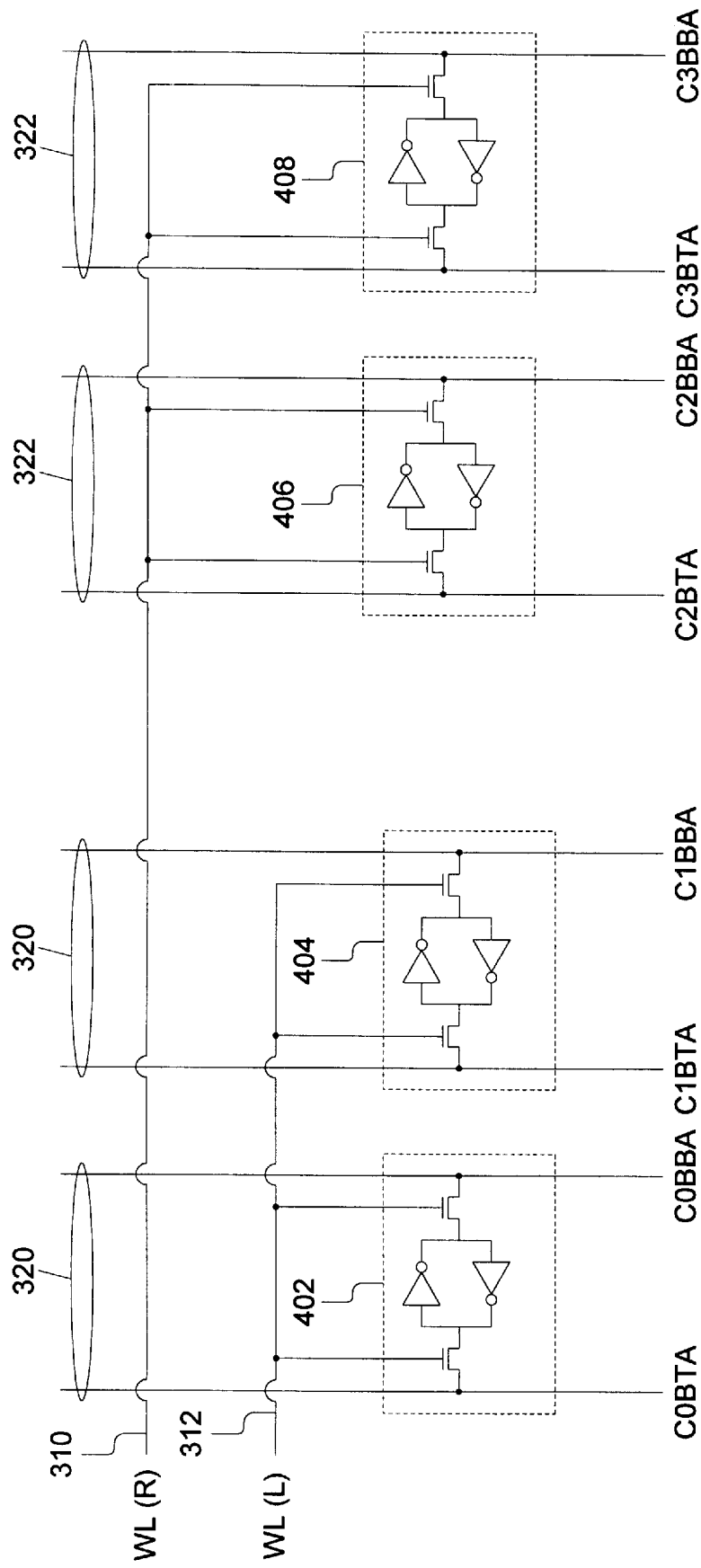
FIG. 6A is a block diagram of a first embodiment for the plurality of cells of the multi-bank memory unit where the cells are single port RAM cells.
Figure 6B:
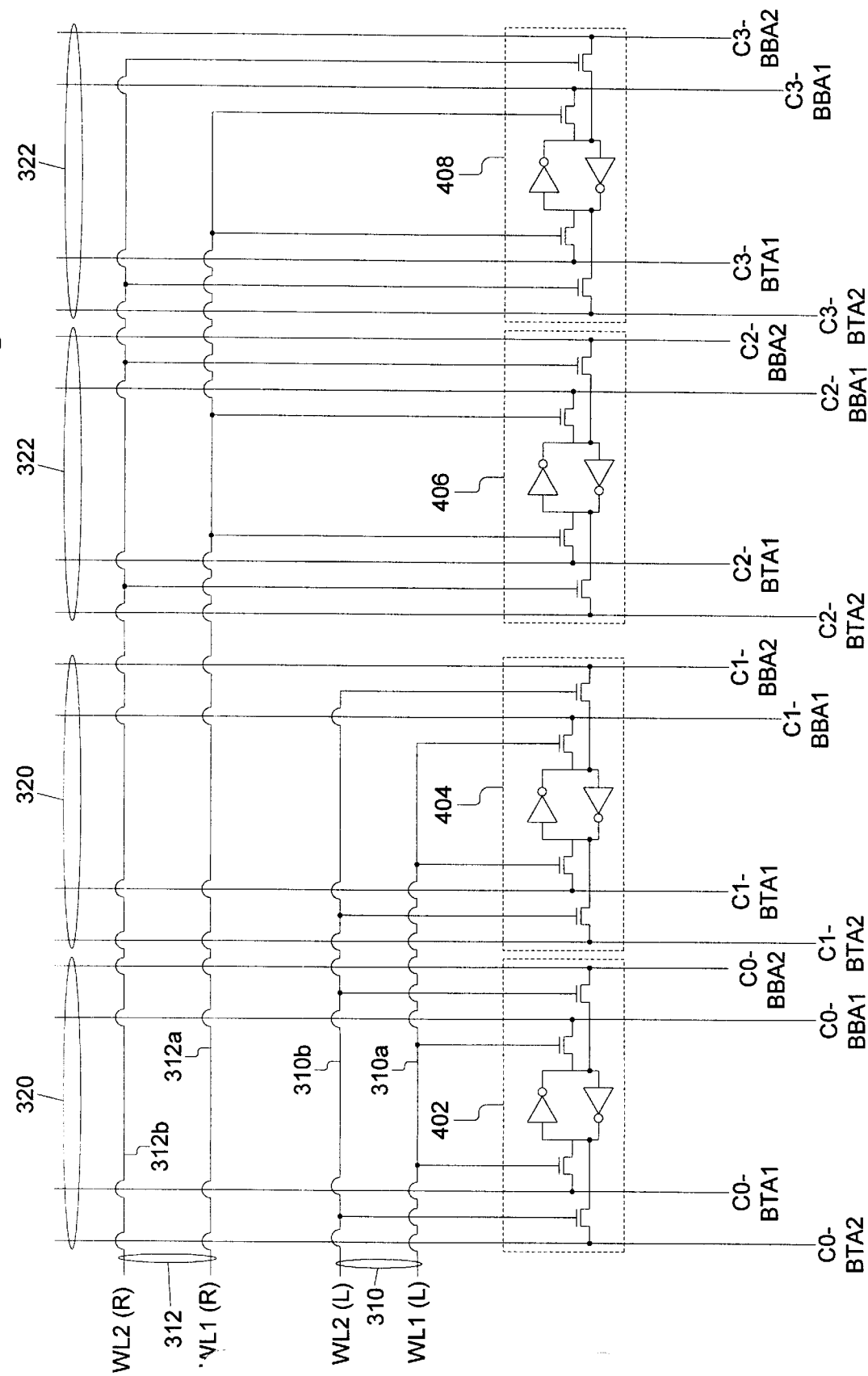
FIG. 6B is a block diagram of a second embodiment for the plurality of cells of the multi-bank memory unit where the cells are dual port RAM cells.

It should be noted that for the embodiment where the array 212b is comprised of dual port memory cells, each cell will provide four bit lines to the Y-multiplexer and pre-charging circuit 222b and thus the corresponding portion 500b of the Y-multiplexer and pre-charging circuit 222b would provide two sense amplifiers and basically be the circuit shown in FIG. 5 duplicated with the control lines 304, 302 and data lines 320, 322 appropriately coupled corresponding to FIG. 3B and FIG. 6B as will be understood to one skilled in the art.

Figure 6C:
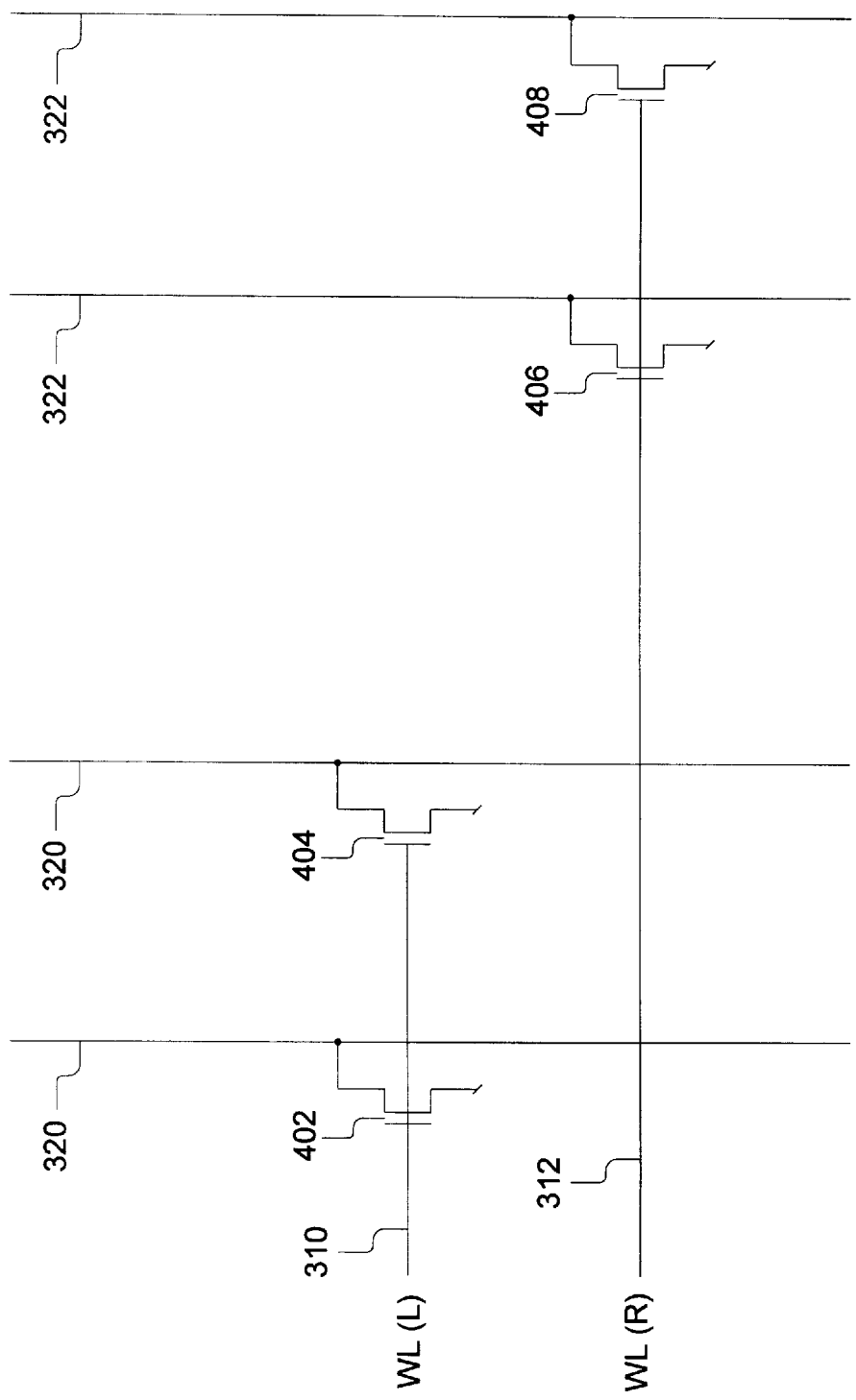
FIG. 6C is a block diagram of a third embodiment for the plurality of cells of the multi-bank memory unit where the cells are ROM cells.

Referring now to FIGS. 6A–6C, various embodiments for the cells 402, 404, 406, 408 of FIG. 4 are shown. FIG. 6A shows a first embodiment where each cell 402, 404, 406, 408 is a six transistor single port RAM cell. As shown in FIG. 6A, the first embodiment forms each cell 402, 404, 406, 408 from a pair of inverters and a pair of transistors. Each cell 402, 404, 406, 408 has a pair of bit lines (BTA, BBA) and a word line input for control. The respective pair of bit lines (BTA, BBA) correspond to signal line 320 or 322. The inverters of each cell 402, 404, 406, 408 are coupled input to output and the transistors couple the inverters to respective bit lines as shown. One transistor couples the input of one inverter and the output of the other inverter to a first bit line, BTA, and the second transistor couples the output of the same inverter and the input of the other inverter to the second bit line BBA. The gates of both transistors are coupled together and to a word line 310, 312 to receive signals from the corresponding word line driver. More specifically, the gates of the transistors for cells 402, 404 are coupled together and to word line 312 since they are in the left plane, and the gates of the transistors for cells 406, 408 are coupled together and to word line 310. Each cell also has a first and second bit line as noted above.

A second embodiment for the cells 402, 404, 406, 408 is shown in FIG. 6B. In the second embodiment for the cells 402, 404, 406, 408, each cell is a dual port RAM cell formed from eight transistors. Each cell 402, 404, 406, 408 preferably comprises a pair of inverters and four transistors. Each cell 402, 404, 406, 408 has a four of bit lines (BTA1, BTA2, BBA1, BBA2) and a pair of word line (WL1, WL2) inputs for control. Collectively, bit lines (BTA1, BBAL) and a word line (WL1) from one port, and bit lines (BTA2, BBA2) and the other word line (WL2) from other port for each cell. In this second embodiment, the four bit lines (BTA1, BTA2, BBA1, BBA2) correspond to line 320/322 and the first and second word lines 310a, 310b correspond to word lines 310 of FIG. 4. The inverters of each cell 402, 404, 406, 408 are coupled input to output and the transistors couple the inverters to respective bit lines as shown. One transistor couples the input of one inverter and the output of the other inverter to a first bit line, BTA, for each port and the second transistor couples the output of the same inverter and the input of the other inverter to the second bit line, BBA, for each port. The gates of transistors of corresponding ports are coupled together and to a respective word line 310a, 310b, 312a, 312b to receive signals from the corresponding word line driver. Thus, the first and second cells 402, 404 are responsive to the two word lines WL1(L) and WL2(L), and the third and fourth cells 406, 408 are responsive to two word lines WL1(R) and WL2(R).

Referring now to FIG. 6C, a third embodiment for the cells 402, 404, 406, 408 is shown. In the third embodiment, each of the cells 402, 404, 406, 408 is a read-only memory cell formed from a single transistor. The gates of each transistor form the word line inputs to the cells 402, 404, 406, 408, with the gates of the first two cells 402, 404 coupled to the first word line 310 and the gates of the second two cells 406, 408 coupled to the second word line 312. Each transistor is coupled between ground and a respective bit line, which in this embodiment is a single line connector. This embodiment illustrates that the present invention advantageously may be used with any memory cell such as but not limited to EPROM, $E^2$PROM, Flash memory and DRAMs to yield lower power and area saving.

It is to be understood that the specific mechanisms and techniques that have been described are merely illustrative of one application of the principles of the invention. Numerous additional modifications may be made to the apparatus described above without departing from the true spirit of the invention.

What is claimed is:

1. A multiple bank memory device, the device comprising:
    a combined array for storing and providing data, the combined array having a first array and a second array that are alternatively accessible, each of the first array and the second array addressable in two dimensions, the combined array having a plurality of data lines and a plurality of control inputs; and
    control logic for receiving control signals, the control logic having inputs and outputs, the inputs of the control logic coupled to receive address, read and write control signals, and the outputs of the control logic coupled to the control inputs of the combined array, the control logic using at least one bit of the control inputs to perform decoding in two dimensions.

2. The memory array of claim 1, further comprising a reference column, the reference column providing a self timed reset signal to both the first array and the second array.

3. The memory array of claim 1, wherein only a single bit of the control inputs is used to perform decoding in two dimensions.

4. The memory array of claim 1, further comprising:
    an x-decoder having inputs and outputs for receiving control signals and outputting a signal indicating the row of the combined array to be addressed, the input of the x-decoder coupled to the control logic;
    a first line driver for asserting, amplifying and sending control signals to the first array, the first line driver having a first input, a second input and an output, the first input of the first line driver coupled to the output of the x-decoder, the output of the first line driver coupled to control inputs of the first array;
    a second line driver for asserting, amplifying and sending control signals to the second array, the second line driver having a first input, a second input and an output, the first input of the second line driver coupled to the output of the x-decoder, the output of the second line driver coupled to control inputs of the second array; and
    wherein the control logic includes pre-decode logic coupled to receive control signals, the pre-decode logic generating a first signal and a second signal based on the bit of the control inputs to alternatively activate the first line driver and the second line driver, the control logic coupled to the second input of the first line driver to provide the first signal, and coupled to the second input of the second line driver to provide the second signal.

5. The memory array of claim 4, wherein the first and second word line drivers are positioned on the side of the combined array between the x-decoder and the combined array.

6. The memory array of claim 1, further comprising a plurality of sense amplifiers, and wherein each sense amplifier is coupled to a bit line of the first array and a corresponding bit line of the second array.

7. The memory array of claim 1, further comprising
    a first pre-charge circuit having a control input, the first pre-charge circuit activated in response to a signal on the control input, the first pre-charge circuit coupled a first bit line, the first pre-charge circuit charging the first bit line;
    a second pre-charge circuit having a control input, the second pre-charge circuit activated in response to a signal on the control input, the second pre-charge circuit coupled a second bit line, the second pre-charge circuit charging the second bit line;
    a y-multiplexer having a first input coupled to the first bit line, a second input coupled to the second bit line, and control input and output, the y-multiplexer providing one from signal from the first and second input of the y-multiplexer at the output of the y-multiplexer in response to a control signal on the control input of the y-multiplexer; and
    wherein the control logic includes pre-decode logic coupled to receive control signals, the pre-decode logic generating a first signal and a second signal based on the bit of the control inputs to alternatively activate the first pre-charge circuit and the second pre-charge circuit, the control logic coupled to the control input of the first pre-charge circuit and the control input of the y-multiplexer to provide the first signal, and coupled to the control input of the second pre-charge circuit to provide the second signal.

8. The memory array of claim 7, wherein the first bit line corresponds to cells in the first array and the second bit line corresponds to cells in the second array.

9. The memory array of claim 7, further comprising an additional first pre-charge circuit, second pre-charge circuit and y-multiplexer coupled as described in claim 7 for each pair of bit lines with one bit line of the pair coupled to the first array and the other bit line of the pair coupled to the second array.

10. The memory array of claim 1, wherein the combined array includes a plurality of memory cells and wherein each of the memory cell is a single port RAM cell formed from a plurality of transistors.

11. The memory array of claim 1, wherein the combined array includes a plurality of memory cells and wherein each of the memory cell is a dual port RAM cell formed from a plurality of transistors.

12. The memory array of claim 1, wherein the combined array includes a plurality of memory cells and wherein each of the memory cell is a read only memory cell formed from a plurality of transistors.

13. The memory array of claim 1, wherein the combined array includes a plurality of memory cells and wherein each of the memory cell is a $E^2PROM$ cell formed from a plurality of transistors.

14. The memory array of claim 1, wherein the combined array includes a plurality of memory cells and wherein each of the memory cell is a EPROM cell formed from a plurality of transistors.

15. The memory array of claim 1, wherein the combined array includes a plurality of memory cells and wherein each of the memory cell is a DRAM cell formed from a plurality of transistors.

16. The memory array of claim 1, wherein the combined array includes a plurality of memory cells and wherein each of the memory cell is a flash memory cell formed from a plurality of transistors.

* * * * *